US006584481B1

(12) United States Patent
Miller

(10) Patent No.: US 6,584,481 B1
(45) Date of Patent: Jun. 24, 2003

(54) FPGA IMPLEMENTED BIT-SERIAL MULTIPLIER AND INFINITE IMPULSE RESPONSE FILTER

(75) Inventor: Andrew J. Miller, Surrey (GB)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/215,778

(22) Filed: Aug. 9, 2002

Related U.S. Application Data

(62) Division of application No. 09/358,508, filed on Jul. 21, 1999, now Pat. No. 6,438,570.

(51) Int. Cl.[7] .............................................. G06F 17/10
(52) U.S. Cl. ...................................................... 708/320
(58) Field of Search ................................ 708/300, 301, 708/307, 313, 315, 319, 320, 322, 323

(56) References Cited

U.S. PATENT DOCUMENTS

| | | | | | |
|---|---|---|---|---|---|
| 3,633,014 | A | * | 1/1972 | Lemp et al. | 708/323 |
| 3,714,402 | A | * | 1/1973 | Baumwolspiner | 708/320 |
| 3,777,130 | A | | 12/1973 | Croisier et al. | |
| 4,569,031 | A | * | 2/1986 | Backes | 708/300 |
| 4,680,727 | A | | 7/1987 | White | |
| 4,839,847 | A | | 6/1989 | Laprade | |
| 4,860,240 | A | | 8/1989 | Hartley et al. | |
| 4,970,674 | A | | 11/1990 | White | |
| 4,970,676 | A | | 11/1990 | Fling | |
| 4,994,997 | A | | 2/1991 | Martin et al. | |
| 5,033,019 | A | | 7/1991 | White | |
| 5,034,909 | A | * | 7/1991 | Hartley | 708/320 |
| 5,339,265 | A | | 8/1994 | Liu et al. | |
| 5,371,753 | A | | 12/1994 | Adsett | |

OTHER PUBLICATIONS

Advance Product Specification (Ver 1.6) "Virtex 2.5V Field Programmable Gate Arrays", Jul. 13, 1999, available from Xilinx, Inc., 2100 Logic Drive, San Jose, CA 95124.

Craig Marven and Gillian Ewers, "A Simple Approach to Digital Signal Processing", 1996, published by John Wiley & Sons, (Wiley–Interscience Publication), pp. 101–102.

Nekooar and Moriarty, "Digital Control Using Digital Signal Processing", published by Prentice Hall, 1999, p. 11.

James W. Cooley and John W. Tukey, "An Algorithm for the Machine Calculation of Complex Fourier Series," Mathematics of Computation, A Quarterly Jouirnal edited by Harry Polachek, vol. 19, No. 89–92, Apr. 1965, pp. 297–301.

Bernie New, "A Distributed Arithmetic Approach to Designing Scalable DSP Chips", EDN, Aug. 17, 1995, pp. 107–114.

Stanley A. White, "Applications of Distributed Arithmetic to Digital Signal Processing: A Tutorial Review," IEEE ASSP Magazine, Jul. 1989, pp. 4–19.

Xilinx, Inc. "The Programmable Logic Data Book", 1999, available from Xilinx, Inc., 2100 Logic Drive, San Jose, CA 95124, pp. 3–3 through 3–22.

* cited by examiner

*Primary Examiner*—Chuong Dinh Ngo
(74) *Attorney, Agent, or Firm*—LeRoy D. Maunu; Edel M. Young

(57) ABSTRACT

A bit-serial multiplier and an infinite impulse response filter implemented therewith, both implemented on an FPGA, are described in various embodiments. The bit-serial multiplier includes function generators configured as a multiplicand memory, a multiplier memory, a product memory, a bit-serial multiplier, and a bit-serial adder. The function generators are arranged to perform bit-serial multiplication of values in the multiplier and multiplicand memories.

6 Claims, 14 Drawing Sheets

FPGA IMPLEMENTED BIT-SERIAL MULTIPLIER AND INFINITE IMPULSE RESPONSE FILTER

This is a Divisional of Application Ser. No. 09/358,508, filed on Jul. 21, 1999, now U.S. Pat. No. 6,438,570.

CROSS-REFERENCE TO RELATED APPLICATIONS

U.S. Pat. No. 5,991,788 issued Nov. 23, 1999 entitled "A Method for Configuring an FPGA for Large FFTs or Other Vector Rotation Computations" by Lester Mintzer is related to the present application and is incorporated herein by reference.

FIELD OF THE INVENTION

The present invention generally relates to digital infinite impulse response (IIR) filters, and more particularly to the implementation of an IIR filter on a field programmable gate array (FPGA).

BACKGROUND

An example programmable logic device (PLD) is the field programmable gate array (FPGA), first introduced by Xilinx in 1985. PLDs such as FPGAs are becoming increasingly popular for use in electronics systems. For example, communications systems employ FPGAs in large measure for their re-programmability. In general, the use of FPGAs continues to grow at a rapid rate because they permit relatively short design cycles, reduce costs through logic consolidation, and offer flexibility in their re-programmability. The capabilities of and specifications for Xilinx FPGAs are set forth in "The Programmable Logic Data Book," published in 1999 by Xilinx, Inc., pp. 3-3 through 3-22.

Advances in semiconductor process technology are delivering FPGAs having logic densities in the range of a million system gates and having operating speeds in excess of 100 MHz. These powerful devices are capable of and have been used to implement digital signal processing (DSP) algorithms which are inherently parallel and normally require multiple DSP microprocessors in order to meet the high data rates. It is feasible to implement such algorithms on a single FPGA because such devices offer a programmable parallel architecture.

For applications requiring sample rates in the range of tens of MHz, for example, radar, HDTV, and digital video broadcasting, the consolidation of multiple DSP microprocessors into a single FPGA has been popular for economic as well as performance reasons. However, applications requiring lower sample rates in the range of tens of kHz (for example, industrial digital control systems, servo-motor controllers, and pick-and-place controllers) have not realized the benefit of DSP algorithms implemented on FPGAs. The lack of implementations of DSPs on FPGAs for low sample rate applications may partially be a result of economics. Sequential, low-cost DSPs provide designers with solutions for low sample rate applications, while FPGAs would require a new design methodology, new designs, and marginal cost advantages if FPGA resources are not used efficiently.

Filters are key elements in digital controller technology, and IIR structures are often chosen as the implementation. Filters are used, for example, for low pass and band pass filtering to remove the effects of EMF induced noise. Many fixed-point DSP processors are available to implement IIR filters. However, many of the economical fixed-point DSP processors are 16-bit processors which limits the precision achievable with the filter.

FIR filters often require a large number of taps as compared to IIR filters, thereby requiring many DSP processor clock cycles. However, this can be addressed with higher performance DSP processors. FIR filters can alternatively be implemented on FPGAs. However, memory to store the samples for many taps becomes the limiting factor in implementing large order FIR filters on FPGAs. Thus, the solution often chosen is procuring a faster DSP processor.

IIR filters can be used in place of FIR filters, and they require far fewer taps. In addition, when a sample is input to a FIR filter, there will be a number of system level delays (each delay period denoted as $Z^{-1}$) before the input sample influences the output. A sample input to an IIR filter, in contrast, influences the output immediately. In an IIR filter, an input sample value is scaled by a single coefficient, usually close to 1.0. Therefore, a large portion of the newest sample has an immediate effect on the output. However, IIR filters require much greater precision to maintain stability. In view of the cost of high precision DSPS, IIR filters are less often implemented on DSPs.

While an FPGA possesses all the resources required to implement a cost-effective IIR filter that meets low sample rate performance objectives, an FPGA design is generally not chosen because it is not understood how to implement an IIR filter on an FPGA in a manner that uses resources efficiently. An apparatus that address the aforementioned problems, as well as other related problems, is therefore desirable.

SUMMARY OF THE INVENTION

In various embodiments, the invention provides an FPGA implementation of a bit-serial multiplier and an IIR filter implemented therewith. In accordance with one embodiment, a bit-serial multiplier implemented on an FPGA is provided. The bit-serial multiplier comprises function generators configured as multiplicand, multiplier, and product memories. A 2's-complement 1×1 bit multiplier is implemented with at least two function generators and is coupled to the multiplier and multiplicand memories. A 1×1 bit adder is implemented with at least two function generators and is coupled to the output of the multiplier. The adder accumulates partial results in the product memory. A control circuit is coupled to address inputs of the multiplicand, multiplier, and product memories.

In another embodiment, an n-order infinite impulse response filter is implemented in an FPGA. The filter is comprised of n function generators configured as sample memories. A first one of the sample memories is configured with a data input to receive a sample input value, and others of the sample memories serially coupled with data outputs coupled to data inputs. Another n−1 function generators are configured as feedback memories. A first one of the feedback memories is configured with a data input to receive a feedback input value, and others of the feedback memories are serially coupled with data outputs coupled to data inputs. An additional 2n−1 function generators are configured as coefficient memories, and another 2n−1 function generators are configured as bit-serial multipliers, each coupled to outputs of a respective sample/coefficient memory pair and feedback/coefficient memory pair. The multipliers coupled to sample/coefficient memory pairs are sample multipliers, and the multipliers coupled to the feedback/coefficient memory pairs are feedback multipliers. Another 2n−1 function generators are configured as bit-serial adders. A feed-forward chain includes n−1 of the bit-serial adders coupled with the sample multipliers, and n−1 others of the bit-serial adders are coupled with the feedback multipliers as a feedback chain. A first adder of the feed-forward chain is coupled to outputs of two of the sample multipliers, a first adder of the feedback chain is coupled to outputs of two of the feedback multipliers, others of the adders in the feed-forward chain are coupled to respective outputs of multiplier/adder pairs in the feed-forward chain, and others of the adders in the feedback chain are coupled to respective outputs of multiplier/adder pairs in the feedback chain. One of the adders is coupled to a last adder in the feed-forward chain and a last adder in the feedback chain. A scaling accumulator is implemented with a plurality of function generators and includes an adder and a memory. The adder of the accumulator has a data input coupled to the output of the one adder and an output coupled to the memory of the accumulator and to a first one of the feedback memories, and the memory of the accumulator has an output coupled to an input of the adder of the accumulator. A control circuit is arranged to address the sample, coefficient, and feedback memories and the memory of the accumulator.

BRIEF DESCRIPTION OF THE DRAWINGS

Various aspects and advantages of the invention will become apparent upon review of the following detailed description and upon reference to the drawings in which.

DETAILED DESCRIPTION

FPGAs have ample performance characteristics to implement IIR filter structures. An FPGA operating at 100 MHz has a clock period of 10 ns, and a data stream of 10 kHz has a sample period of 100,000 ns. Thus, an FPGA function operating at 100 MHz would have 10,000 clock cycles to process each 10 kHz data sample. An IIR filter implemented on an FPGA, in accordance with the invention, uses bit-serial functions, which are suitable for low data rate applications. The invention generally uses less area of an FPGA at the expense of requiring more clock cycles. Thus, bit-serial functions operate over many clock cycles but can be implemented in a relatively small area of an FPGA. This enables small FPGAs, for example, XC4000™ series FPGAs from Xilinx to be cost-competitive with fixed-point DSP processors. In addition, high order IIR filters can be implemented using bit-serial techniques without requiring decomposition of the high order filter into cascaded low order filter blocks.

Figure 1A:
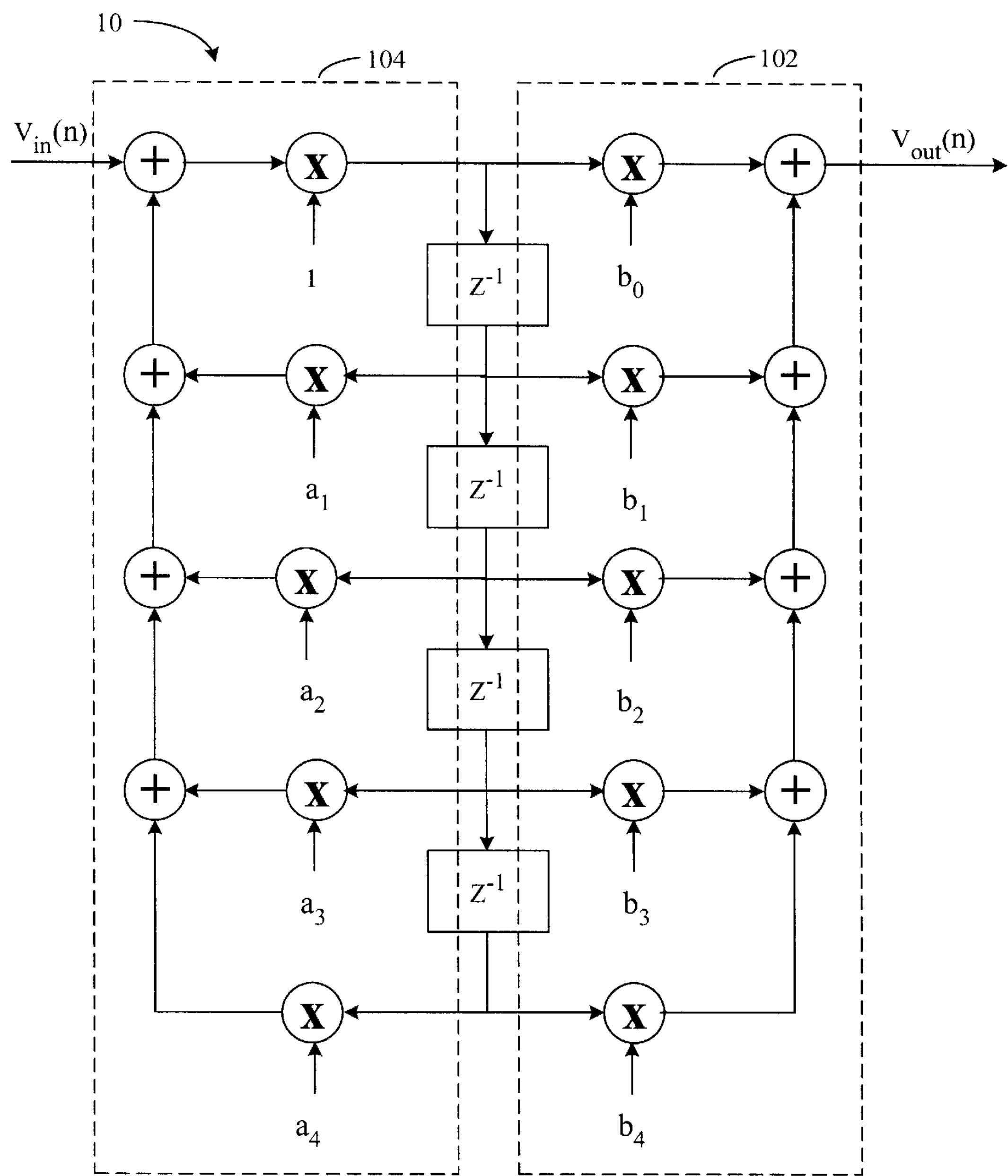
FIG. 1A is a block diagram of an example structure illustrating the transfer function of a "Direct Form II" $5^{th}$ order IIR filter.

FIG. 1A is a block diagram of an example structure 10 illustrating the transfer function of a "Direct Form II" $5^{th}$ order IIR filter. Second order IIR structures, such as those described in *Digital Control Using Digital Signal Processing*, 1999, by Nekoogar and Moriarty (Prentice Hall 1999) are frequently used, and those skilled in the art will recognize that such $2^{nd}$ order structures could be extended to implement the illustrated $5^{th}$ order structure.

Structure 10 includes feed-forward path 102 and feedback path 104. Feed-forward path 102 implements the poles of the filter, and feedback path 104 implements the "zeros" of the filter. The formula:

$$\frac{Vout(n)}{Vin(n)} = \frac{b_0 + b_1 Z^{-1} + b_2 Z^{-2} + b_3 Z^{-3} + b_4 Z^{-4}}{1 - a_1 Z^{-1} - a_2 Z^{-2} - a_3 Z^{-3} - a_4 Z^{-4}}$$

represents the transform function, which describes how the output behaves with respect to the input. The values $b_0$–$b_4$ in feed-forward path 102 correspond to the numerator coefficients in the equation, and the values $a_1$ –$a_4$ in feedback path 104 correspond to the denominator coefficients in the equation.

$V_{in}(n)$ is the sample input voltage level at timing interval n. Each of the blocks labeled $Z^{-1}$ represents an arbitrary unit of a system level delay that is introduced in feed-forward path 102 and feedback path 104.

Figure 1B:
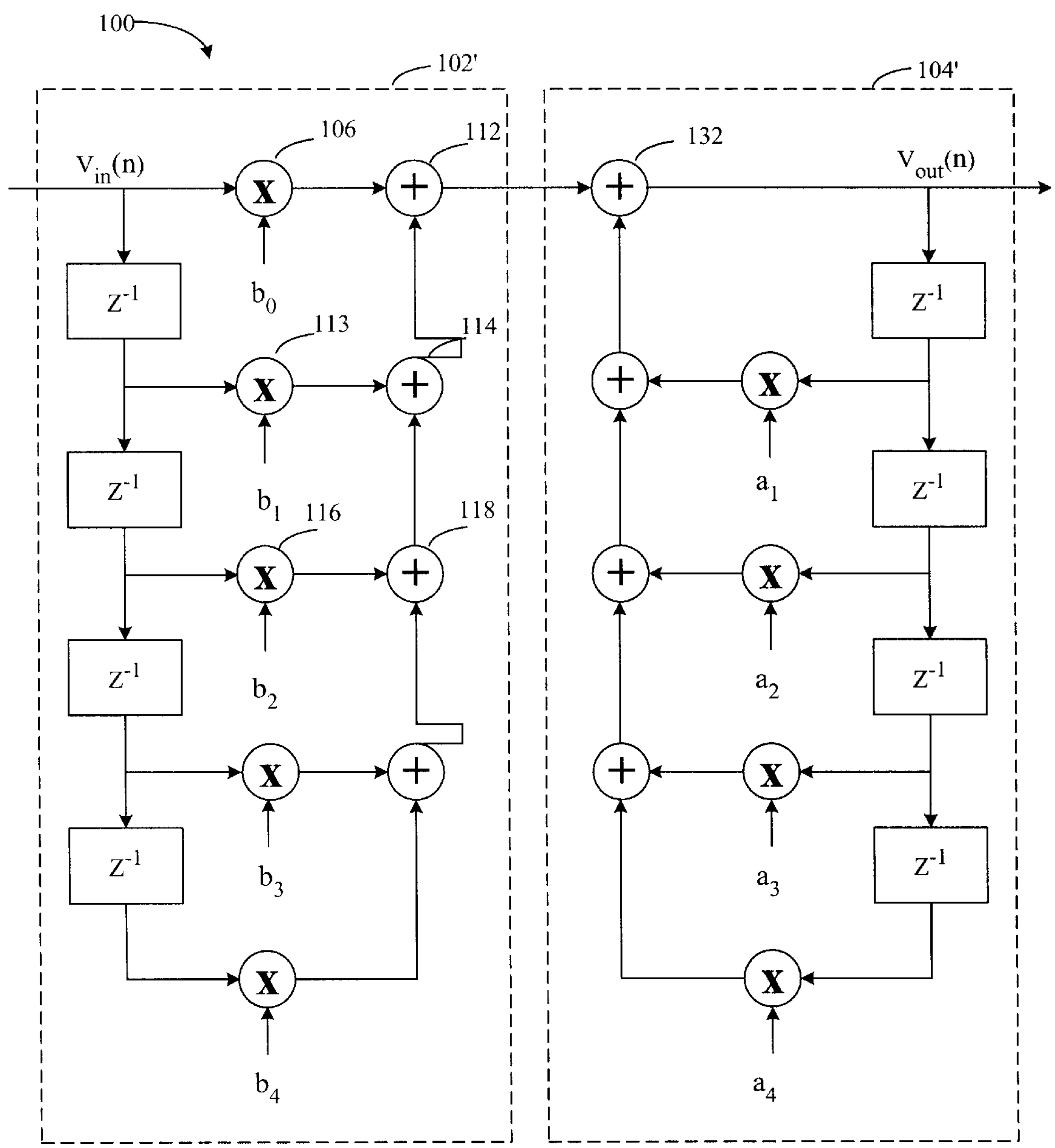
FIG. 1B illustrates the $5^{th}$ order IIR structure of FIG. 1A in which the feed-forward path and the feedback path have been rearranged.

Note that feedback path 104 and feed-forward path 102 can be reordered without changing the transfer function by introducing separate delay blocks for the feed-forward and feedback paths. FIG. 1B illustrates a transfer function of an example $5^{th}$ order IIR structure 100 in which feed-forward path 102' precedes feedback path 104'.

At the first tap, $V_{in}(n)$ is multiplied (multiplier 106) by the coefficient $b_0$, and the result is added (adder 112) to the result of the second tap (multiplier 113 and adder 114). At the second tap after one delay unit, $V_{in}(n)$, is multiplied (multiplier 113) by the coefficient $b_1$, and the result is added (adder 114) to the result of the third tap (multiplier 116 and adder 118). Taps 3 and 4 operate similarly, with tap 3 using the coefficient $b_2$ and output from tap 4, and tap 4 using the coefficient $b_3$ and output from tap 5. Tap 5 multiplies coefficient $b_4$ by $V_{in}(n)$ after 4 delay units. Thus, at time $t_n$, tap 1 is using $V_{in}(n)$, tap 2 is using $V_{in}(n-1)$, tap 3 is using $V_{in}(n-2)$, tap 4 is using $V_{in}(n-3)$, and tap 5 is using $V_{in}(n-4)$ as the sample input voltage level.

Adder 132 adds output from feed-forward path 102' to output from the second tap of feedback 104' to provide the output voltage level $V_{out}(n)$ at time $t_n$. Because the first term in the denominator in the equation is 1, no multiplier is required in the first tap of feedback path 104'. The output voltage level $V_{out}(n)$ is multiplied by coefficient $a_1$ after 1 delay unit, by coefficient $a_2$ after two delay units, by coefficient $a_3$ after 3 delay units, and by coefficient $a_4$ after 4 delay units.

It will be appreciated that there is a direct correlation between the order of an IIR filter, the number of pole-zero pairs that it implements, the number of coefficients that exist in the transfer function and the coefficient position within the structure to be implemented. For each increment in filter order, a new delay/multiplier/adder tap is added to each of the feed-forward and feedback paths. An increase in filter order causes an increase in the number of parallel multiplications within the structure.

Implementing either of structures 10 or 100 in an FPGA often involves various trade-offs, for example, speed for space. However, where sample rates for an application are in the KHz range and FPGAs clocked in the MHz range are available, it is feasible to compromise speed to save space. In various embodiments, the present invention uses bit-serial arithmetic, which requires a relatively small area of an FPGA, to implement multipliers that can be used to implement an IIR filter.

Some FPGAs, such as the XC4000™, Spartan™, and Virtex™ series of FPGAs from Xilinx, can implement a 16×1 ROM or a 16×1 synchronous RAM using a 4-input look-up table (LUT). A LUT is also sometimes referred to as a function generator. Within bit-serial applications, memory blocks larger than 1 bit wide are not required, and the availability of 16 1-bit locations within a single function generator makes the function generator particularly suitable for storing 16-bit coefficients that are serially accessed. An alternative form of 1-bit wide memory is a flip-flop, and serial memory elements would be a chain of flip-flops. Thus, the function generator implementation of a RAM offers a significant density advantage over a chain of flip-flops. For coefficients larger than 16 bits, a pair of function generators in Xilinx FPGAs, for example, can be configured as a single 32×1 RAM.

A RAM implemented with a function generator can also implement the system level sample delays ($Z^{-1}$) within DSP systems. Where two function generators are configured as 16×1 RAMs, connected in series, and share the same address lines, the function generators effectively implement a sample delay $Z^{-1}$. Data stored in the first RAM and serially accessed over 16 cycles is simultaneously written to the second RAM in the chain; the 16-bit word moves from the first RAM to the second RAM over 16 cycles. This aspect will be further described in the discussion accompanying FIG. 5.

Figure 2A:
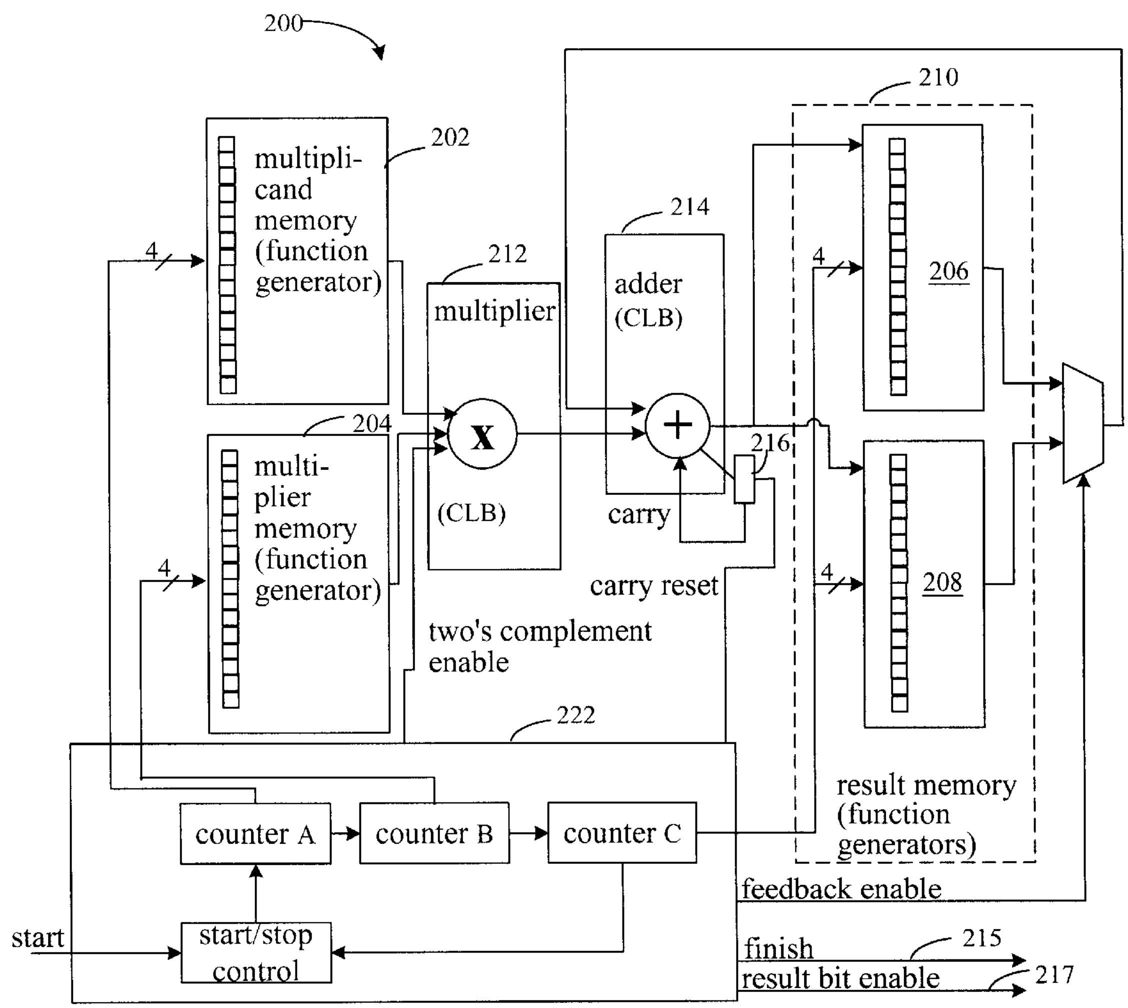
FIG. 2A is a block diagram of a bit-serial multiplier circuit implemented in accordance with an example embodiment of the invention.

In accordance with one embodiment of the invention, a bit-serial multiplier is a building block for the FPGA implemented IIR filter. FIG. 2A is a block diagram of a bit-serial multiplier circuit implemented in accordance with an one embodiment of the invention. Bit-serial multiplier 200 is implemented using a function generator 202 for 1-bit wide RAM storage of the multiplicand and a function generator 204 for 1-bit wide RAM storage of the multiplier. Two function generators 206 and 208, plus a resident MUX in a CLB, implement a 32-bit result memory 210. Function generator 212 generally implements a 1-bit 2's-complementing multiplier, and function generator 214 implements a 1-bit serial adder. Flip flop 216 registers the carry output from adder 214. In Xilinx FPGAs, the complete full adder function (sum and carry) can be implemented in a single CLB. Control logic 222 controls addressing of multiplier, multiplicand, and result memories 202, 204, and 210, two's complement control of multiplier 212, and sequencing of the bit-serial multiplication process, as explained in further detail below.

Result memory 210 and adder 214 function together as a scaling accumulator. The depth of memory 210 determines how many bits of precision can be used to represent the result. In FPGAs such as those from Xilinx, 1-bit memories of various depths can be implemented. Thus, bit-serial multipliers having many bits of precision can implemented, with the attendant trade-off being more clock cycles for more precision. This flexibility is not offered by traditional 16-bit fixed-point DSP processors.

In one embodiment, control logic 222 includes three counters: counter A addresses multiplicand memory 202, counter B addresses multiplier memory 204, and counter C addresses the result memory 210. A start signal commences the multiplication process and control logic 222 executes a sequence of events based on the terminal count values for the three counters. These values are determined by the width of the multiplicand and multiplier. The number of clock cycles required to complete the multiplication is a function of the widths of the multiplicand and multiplier. Specifically, if the multiplicand has n bits and the multiplier has m bits, then the number of cycles is: (n+1)*m.

Generally, the bit of multiplicand 202 that is addressed by counter A is multiplied by the bit of multiplier 204 that is addressed by counter B. Initially, the least significant bit (LSB) of multiplier 204 is multiplied with the bits of multiplicand memory 202 and the results are accumulated in result memory 210. Counter C initially references the first bit of result memory 210 and is incremented as counter A is incremented. In the next iteration, counter B is incremented, counter A is reset, and the next bit of multiplier 204 is multiplied with the bits of multiplicand 202. Counter C is reset to the value of counter B when counter B is incremented. Thus, the next set of values ($B_n$*$A_n$) is shifted one place and scaled. The process continues until all the bits of the multiplier have been multiplied with the bits of the multiplicand.

Multiplier 212 receives three inputs: the two bits from the multiplicand 202 and multiplier 204 and a two's complement enable signal from control block 222. The two's complement enable signal is used when two's complement format values are multiplied and the multiplier is negative.

Adder 214 receives, the output of multiplier 212, the bit of result memory 210 that is addressed by counter C, and the carry bit from the prior addition. The output of adder 214 is provided to result memory 210 and stored in the same bit position as the bit that was provided to adder 214.

The finish signal on line 215 indicates to another logic section (not shown) that multiplier 200 has completed the entire multiplication of the multiplier and multiplicand. In an IIR filter embodiment, the finish signal indicates that IIR filter has finished processing the most recent input sample.

The result bit enable signal on line 217 indicates to another logic section that a result bit can be captured as a valid output bit. It will be appreciated that because the multiplication is serial, the full multiplication result will not appear as a contiguous serial stream of data during the serial multiplication process. Rather, bits in result memory 210 will sporadically be valid, beginning with the LSB and progressing toward the most significant bit (MSB). When the result bit enable signal is active, the bit output from adder 214 is a valid final result bit.

The result bit enable signal provides early access to bits in the result memory that comprise the partial result. This is significant because result memory 210 is a serial memory, and without the result enable signal, a logic section requiring the full result would have to serially shift out the data from result memory 210. Thus, access to the partial result bits before the full result is ready allows another logic section to save clock cycles in obtaining the final result.

Figure 2B:
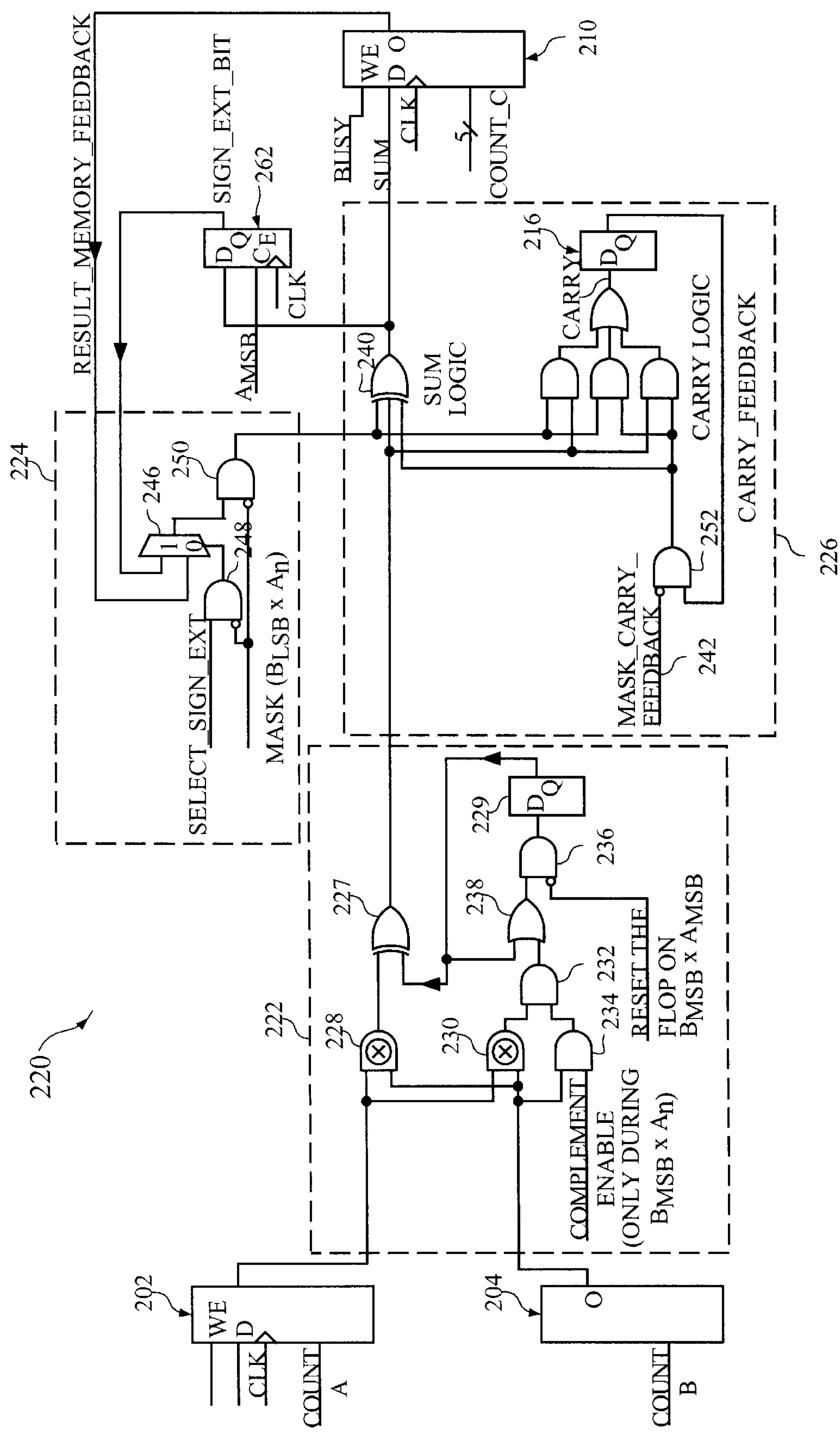
FIG. 2B is a logic diagram that illustrates an example implementation of a 2's-complementing bit-serial multiplier.

FIG. 2B is a logic diagram that illustrates an example implementation of a 2's-complementing bit-serial multiplier 220. Section 223 is a 1×1 bit 2's-complementing multiplier, section 224 is control logic that selects between memory 210 feedback, the result sign extension, or 0 (by virtue of MASK signal being logic level 1 as applied to AND gate 250), and section 226 is a serial full adder with carry feedback logic. Memories 202 and 204 store the values to be multiplied, and memory 210 is the scaling accumulator. Sections 222, 224, and 226 can be implemented in respective CLBs of an FPGA.

Beginning with section 223, the output from section 223 is A*B when 2's-complementing is not enabled, and the output is the 2's-complement of A*B when 2's-complementing is enabled. The logic is constructed based on the fact that the 2's-complement of a binary number is the complement of the binary number plus 1. As a consequence, 2's complementing a number can be achieved by allowing the number to pass through a gate, beginning with the LSB, unmodified up to and including the first 1 bit, and then inverting the bits that follow.

XOR gate 227 functions as a programmable inverter, inverting the output from AND gate 228 when flip-flop 229 outputs a logic level 1, and passing the output from AND gate 228 when flip-flop 229 outputs a logic level 0. AND gate 228 performs a 1-bit multiplication of a bit from memory 202 and a bit from memory 204. Recall that the bits output from memories 202 and 204 are sequenced by counters A and B of FIG. 2A, for example.

AND gate 230 replicates the 1-bit multiplication of gate 228, and the output of AND gate 230 is input to AND gate 232. The other input to AND gate 232 is the output of AND gate 234, which indicates when the B-bit is logic level 1 and complement-enable signal is active (i.e., when the MSB of B is 1). Flip-flop 229 is reset based on the logic of AND gate 236 and OR gate 238. AND gate 236 receives a reset signal that is active when the MSB of A is multiplied by the MSB of B.

Section 226 comprises a serial full adder having a masked feedback path. The output of the adder function is provided by XOR gate 240, which receives inputs from multiplier logic 223, feedback selection logic 224, and a carry bit from flip-flop 216. The carry bit from flip-flop 216 is masked when the MASK_CARRY_FEEDBACK_signal on line 242 is logic level 1. The MASK_CARRY_FEEDBACK logic level 1 when the LSB of the value in memory 204 is multiplied.

Section 224 includes logic that controls the selection of bits for feedback into the adder of section 226. Specifically, section 224 selects between a feedback bit from result memory 210, a sign extension bit from flip-flop 262, or a logic level 0 bit. Selector 246 receives as input the sign extension bit from flip-flop 262 and the feedback bit from memory 210. AND gate 248 controls selector 246 based on the SELECT_SIGN_EXTENSION and MASK control signals, and the selected output from selector 246 is masked by AND gate 250 and the MASK signal. The SELECT_SIGN_EXTENSION signal is logic level 1 when multiplying the MSB of A on the second and subsequent passes through A. The MASK signal is logic level 1 on the first pass through the value in memory 202 (i.e., $B_{LSB}$ is multiplied by $A_n$).

FIGS. 3A–3I and FIGS. 3A'–3I' illustrate operation of a bit-serial multiplier in multiplying −5*−3. Each of FIGS. 3A–3I and 3A'–3I' illustrates one cycle in performing the multiplication; however, some cycles are excluded for brevity.

Figure 3A:
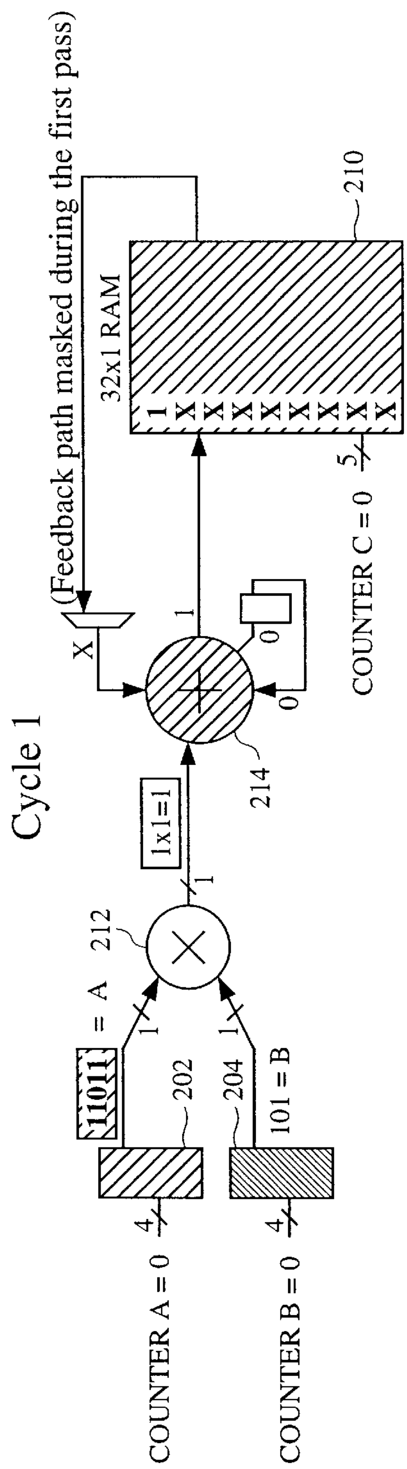
FIGS. 3A–3I and 3A'–3I', illustrate operation of a bit-serial multiplier in multiplying −5*−3.
Figure 3A:
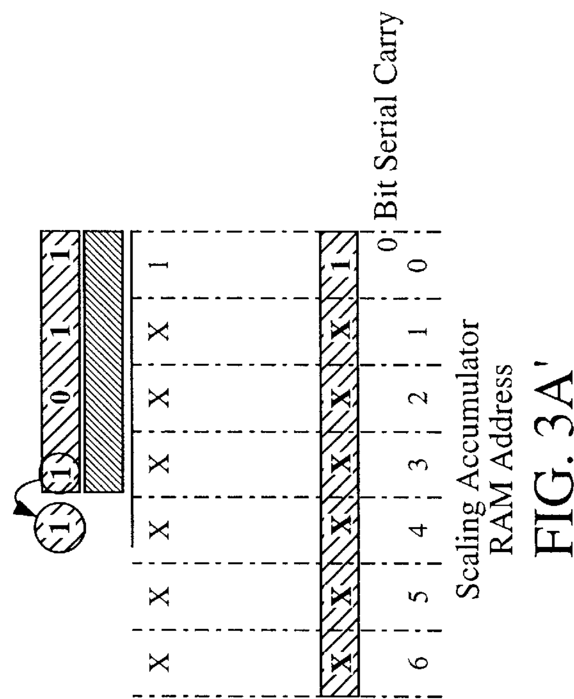

Except for control logic 222 of FIG. 2, the constituent elements of bit-serial multiplier 200 are also depicted in FIGS. 3A–I. Result memory 210 is truncated to 9 bits to save space, and the representative block of result memory 210 is widened to accommodate illustration of multiplication results with each iteration of a bit of the multiplier multiplied by the bits of the multiplicand. Result memory 210 is depicted as a column with the LSB occupying the topmost position. The multiplicand will be referenced as A, and the multiplier will be referenced as B. FIGS. 3A'–3I' illustrate the bits multiplied, added, and accumulated.

The two's complement forms of −5 and −3 are 11011, and 101, respectively. Counter A addresses the bits of −5, and counter B references the bits of −3. Both of counter A and counter B begin at 0, which references the LSBs of A and B, respectively. Counter C also begins at 0 to address the location for the LSB of the product.

It will be appreciated that in FPGAs having flip-flops with synchronous reset operations, these flip-flops can be used instead of the masking performed by AND gates 250 and 252.

FIG. 3A and 3A' illustrate the first cycle in multiplying A by B using a bit-serial multiplier. The LSB of A, which is 1, is multiplied with the LSB of B, which is also 1, in cycle 1. The output of multiplier is 1 and is input to adder 214. Because this is the first cycle, the carry input is 0, and the input from the result memory 210 is masked. The bit value 1 is output from adder 214 and stored as the LSB in result memory 210, as addressed by counter C. It will be appreciated that in applications such as an IIR filter where the bit-serial multiplier is used continuously, result memory 210 will hold the results of the previous multiplication. Thus, the output of result memory 210 must be masked as input to adder 214 when bits of the previous result are still present.

Every iteration through A, the carry value is reset to zero. In the first iteration, that is when the LSB of B is multiplied by the bits of A, the carry value will always be zero because there is nothing from result memory 210 to add to output from multiplier 212.

Figure 3B:
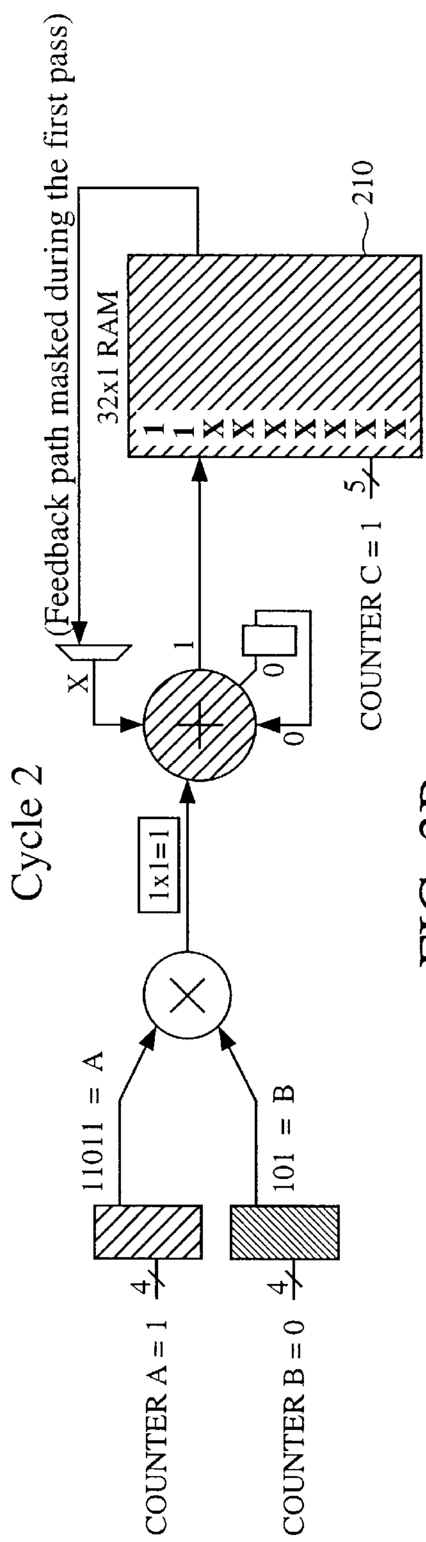
Figure 3B:
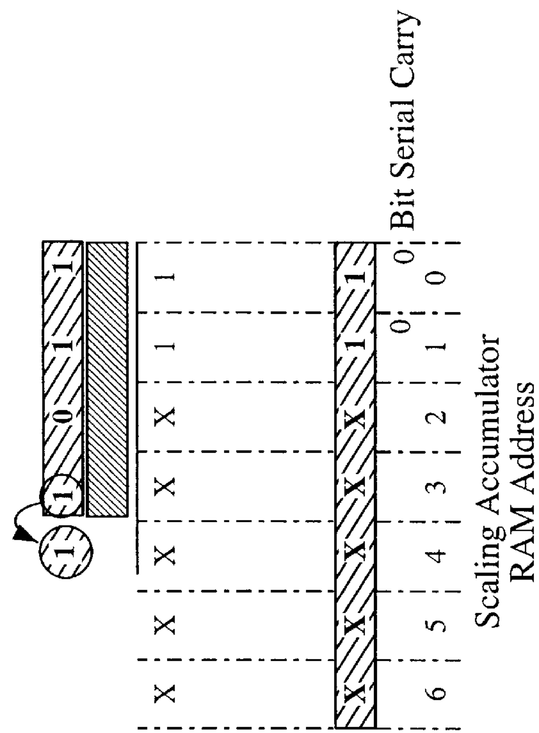

FIGS. 3B and 3B' show cycle 2 of the bit-serial multiplication of −5*−3. In cycle 2, counter A is incremented to address the second LSB of A, and counter C is incremented to address the second LSB of result memory 210. The output of result memory 210 continues to be masked, and there is no carry bit for input to the adder. Thus, the A bit multiplied by the B bit is 1 and is stored in result memory 210 at the address provided by counter C. This process is repeated in cycles 3 and 4, which are not shown in the figures in the interest of brevity.

Figure 3C:
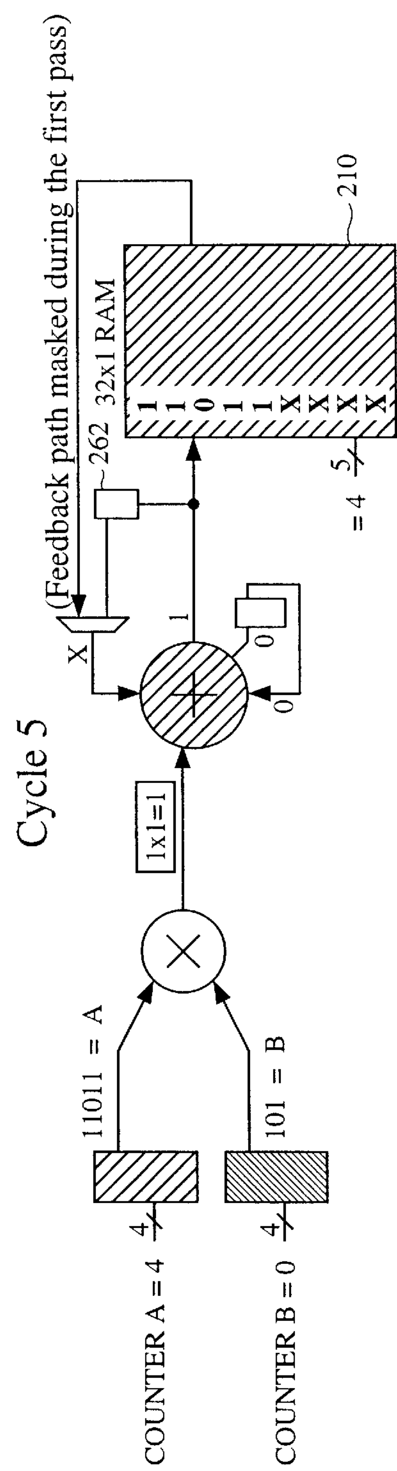
Figure 3C:
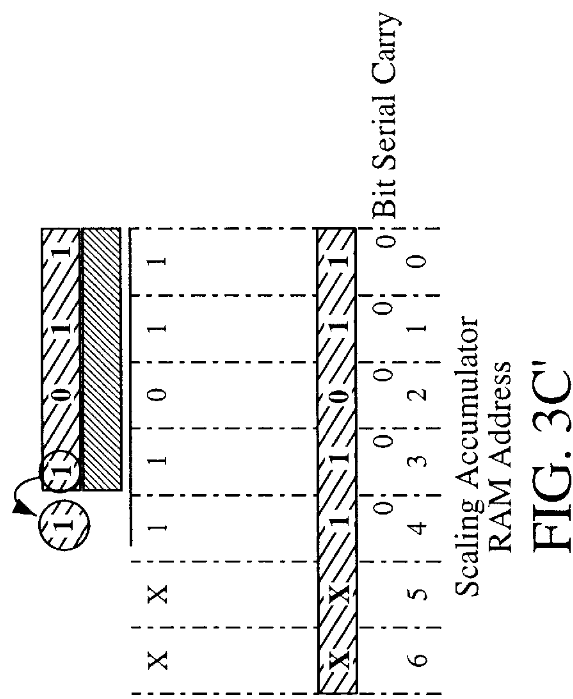

In cycle 5 (as illustrated in FIGS. 3C and 3C'), counter A addresses the MSB of A. The partial product 1 is stored as bit 4 in result memory 210. When the MSB of A is addressed, counter A clock enables counter B, which is incremented when A is reset. In addition, the carry bit is cleared, for example in a Virtex FPGA, as counter B is incremented. It will be appreciated that because Virtex FPGAs have flip-flops with synchronous reset ports, the carry bit can be stored in the flip-flop, which can be subsequently cleared. In an alternative embodiment, in an FPGA that does not have flip-flops with synchronous reset ports, the carry bit can be masked.

After cycle 5, the partial product in result memory 210 is 11011, counter A is reset to 0, counter B is incremented to 1, and counter C is reset to the new value of counter B. Because the A and B are in two's complement form, the MSB from each iteration through A is saved for use in the next iteration. Saving the MSB preserves the sign of the partial result for the next iteration. Thus, bit value 1 is also stored in register 262, the output of which is provided as a sign extension bit and input to selector 272, which is part of the feedback path from result memory 210 to adder 214. The sign extension bit is selected in cycle 10.

Figure 3D:
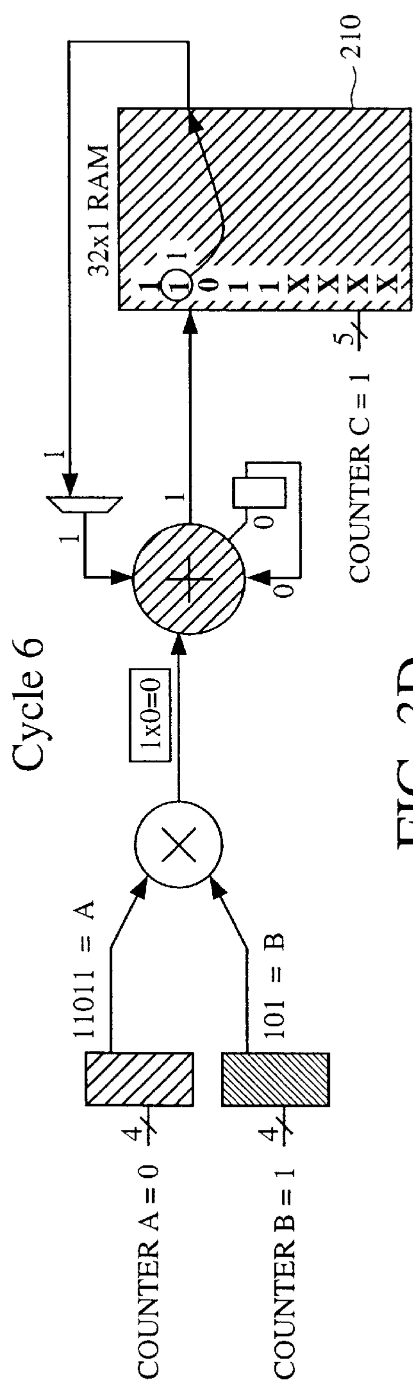
Figure 3D:
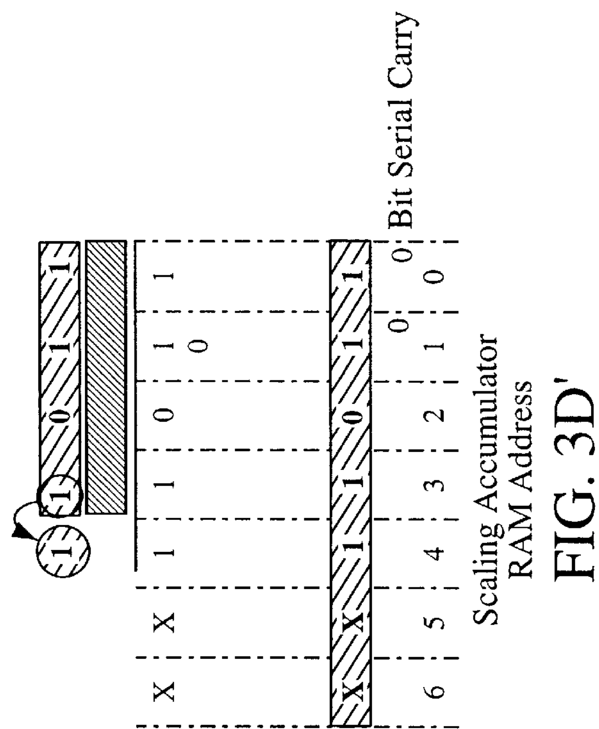

FIGS. 3D and 3D' illustrate cycle 6 of the bit-serial multiplication. Cycle 6 is the first cycle in the iteration that uses bit 1 of counter B. Bit 1 of B (0) multiplied by bit 0 (1) of A is 0, which is added to bit 1 (1) from result memory 210. For this first cycle of the second iteration through A, the carry flop output is masked to ensure that a carry from the MSB of the first iteration does not influence the first bit of the second iteration. Thus, the value 1 is stored in bit 1 of result memory 210, which in the representative block begins a new column. The contents of result memory 210 after cycle 6 are 11011. Note that the addition did not produce a carry bit. The process is repeated for cycles 7, 8, and 9 using bits 1, 2, and 3 of A, respectively.

Figure 3E:
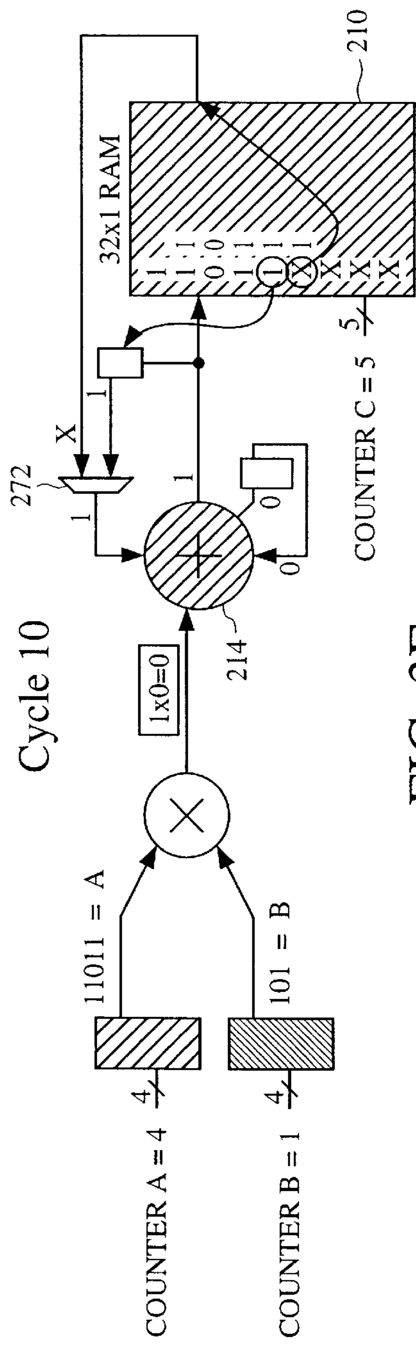
Figure 3E:
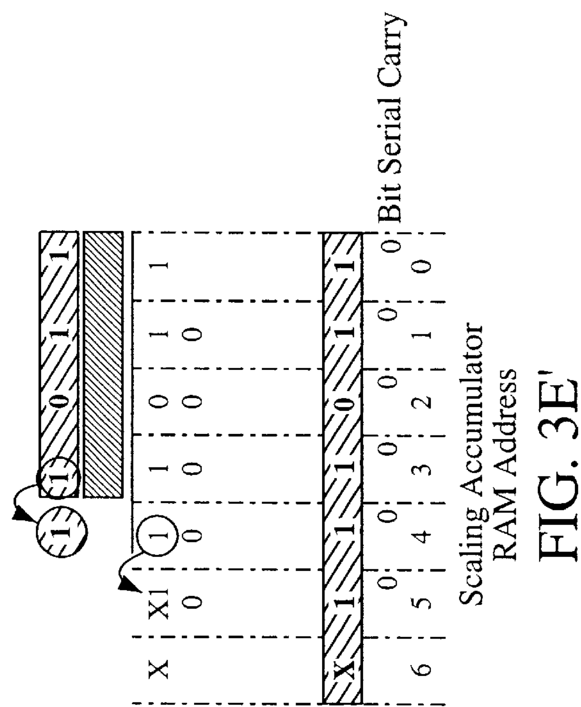

FIGS. 3E and 3E' illustrate cycle 10 of the bit-serial multiplication. Bit 1 (0) of B is multiplied by the MSB (1) of A in cycle 10. The multiplication result, 0 is provided as input to adder 214, along with the carry bit and output from selector 272. Selector 272 receives as input the bit (don't care) from result memory 210 addressed by counter C (5) and the MSB (1) of the prior iteration, which was saved in register 262. The output (1) of adder 214 is stored as bit 5 in result memory 210. The partial product in result memory 210 after the second iteration is 111011.

After cycle 10 and prior to cycle 11, counter A is reset to 0, counter B is incremented (2), counter C is set to the value of counter B (2), and the MSB of the result is written to memory 210 and also saved in register 262 for the next iteration.

Figure 3F:
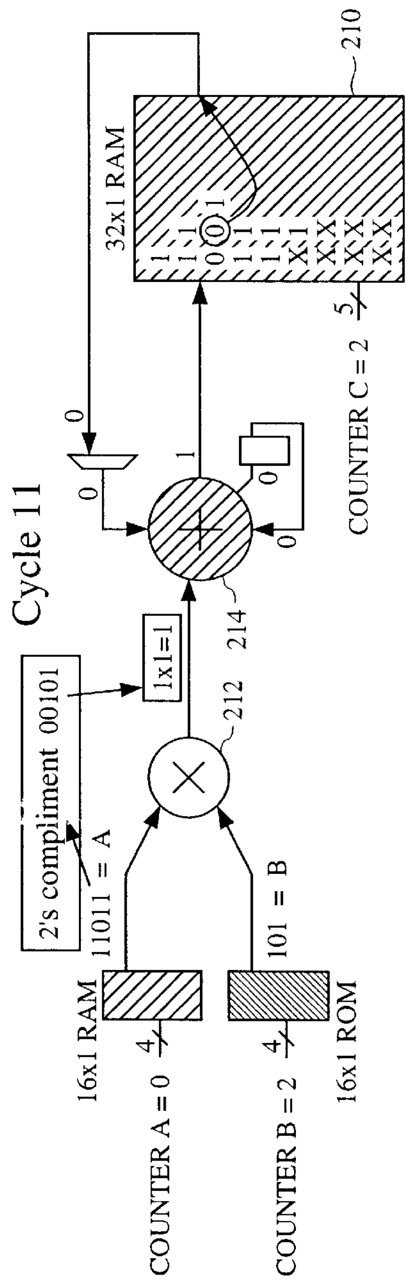
Figure 3F:
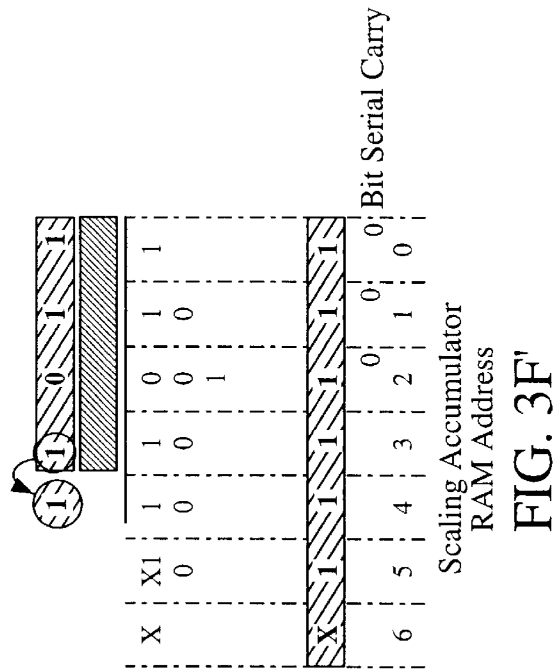

FIGS. 3F and 3F' illustrate cycle 11 of the bit-serial multiplication, in which the MSB of B is referenced by counter B. Because the MSB of B makes B negative, the value of A is two's complemented when multiplying by the MSB of B, as illustrated in FIG. 2B and explained above.

Adder 214 adds the output (1) from multiplier 212, bit 2 (0) of result memory 210, and the carry bit (0), and the resulting partial product bit (1) is stored as the new bit 2 in result memory 210. The process is then repeated for bit 1 of A and bit 2 of B in cycle 12 (not shown). Because the LSB of A is multiplied during cycle 11, the carry bit is masked (e.g., see the MASK__CARRY__FEEDBACK signal of FIG. 2B).

Figure 3G:
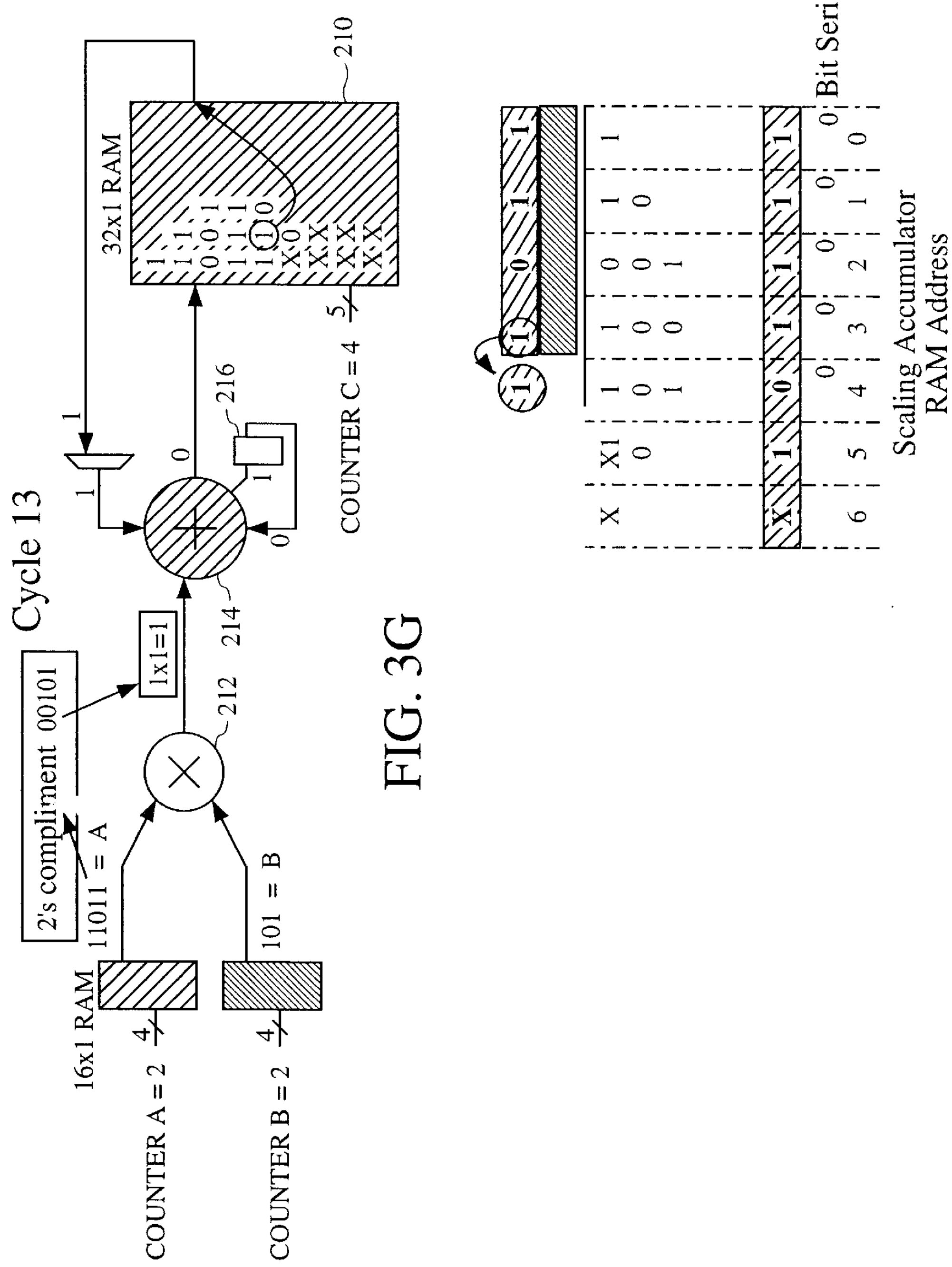

FIGS. 3G and 3G' illustrate cycle 13 in the bit-serial multiplication, in which the partial product is accumulated from bit 2 of A and bit 2 of B. Adder 214 adds output (1) of multiplier 212, bit 4 (1) of result memory 210, and the carry bit (0) of the prior addition. The output (0) of adder 214 is stored as the new bit 4 in result memory 210. With this example, this is the first addition in which a carry bit value of 1 is generated, which is stored in register 216 for the next addition (cycle 14).

Figure 3H:
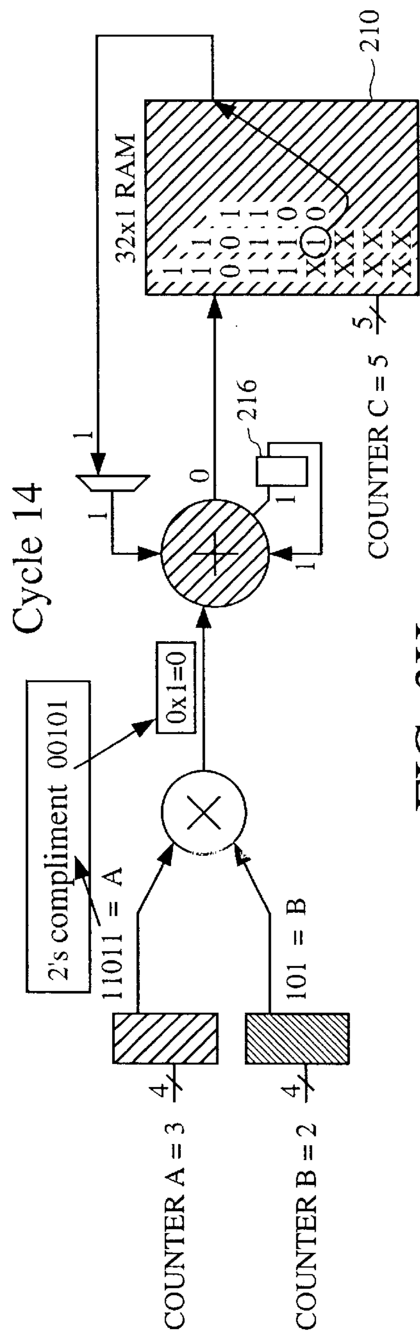
Figure 3H:
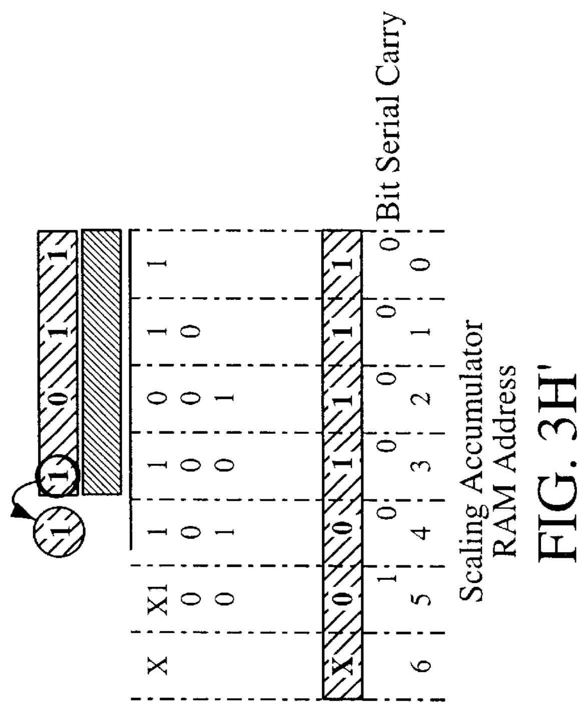

Cycle 14 of the bit-serial multiplication is illustrated in FIGS. 3H and 3H'. Bit 2 of B (1) is multiplied by the two's complemented value of bit 3 of A (0), and the result (0) is added to the carry bit (1) and bit 5 (1) of result memory 210. The partial product bit (0) is stored in bit 5 of result memory 210, and the carry bit (1) is stored in register 216.

Figure 3I:
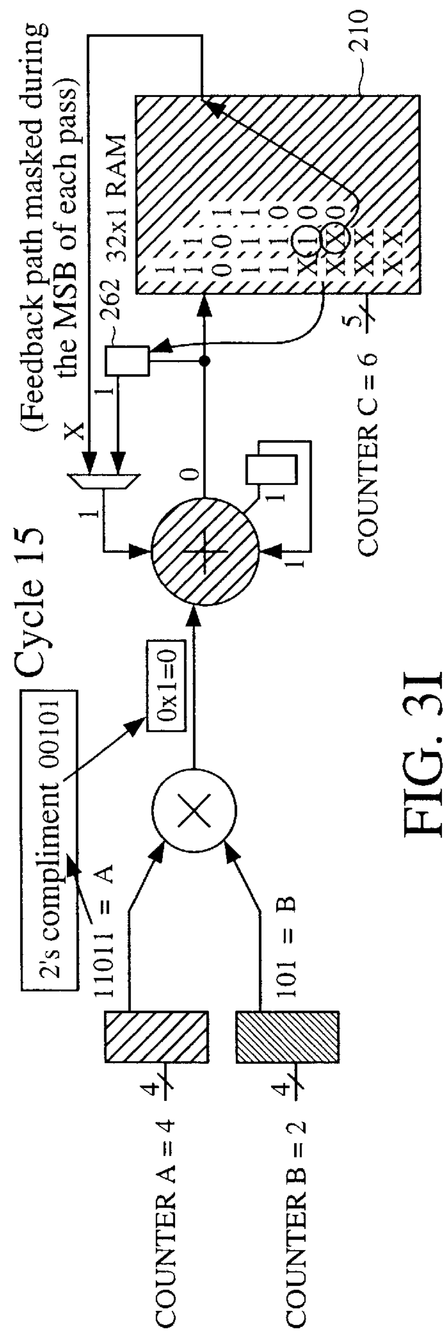
Figure 3I:
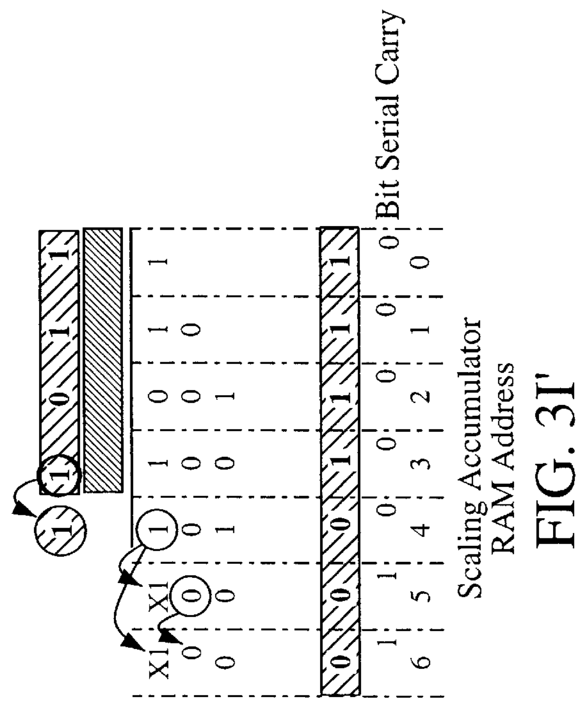

Cycle 15 is the last cycle in the bit-serial multiplication and is illustrated in FIGS. 3I and 3I'. Bit 2 of B (1) is multiplied by the two's complemented value of bit 4 of A (0), and the result (0) is added to the carry bit (1) and the MSB (1 from register 262) of the prior iteration (saved in cycle 10). The partial product bit (0) is stored in bit 6 of result memory 210, and the carry bit (1) is stored in register 216. Because the multiplicand is sign extended by 1 bit during the initial serialization process prior to storage in serial memory 202, the carry bit in the final cycle can be ignored, which simplifies the control logic. The final product in result memory 210 is 0001111, or decimal +15 in 2's complement form.

Figure 4:
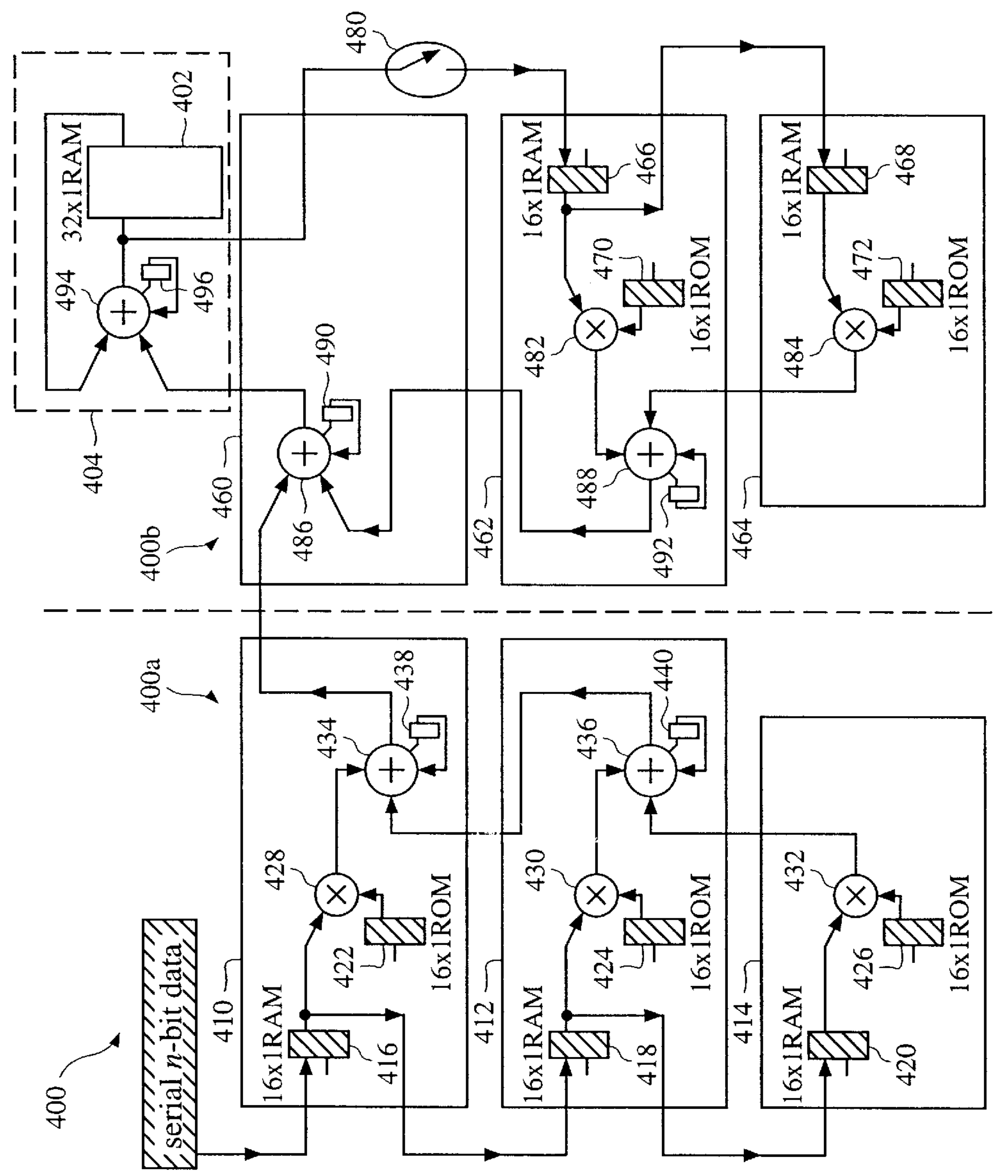
FIG. 4 is a block diagram of a $3^{rd}$ order IIR filter implemented in accordance with an example embodiment of the invention.

FIG. 4 is a block diagram of a 3$^{rd}$ order IIR filter implemented in accordance with an example embodiment of the invention. Filter 400 is constructed using multiple instances (shown in FIG. 4 as multipliers 428, 430, 432, 482, and 484) of the 2's-complementing bit-serial multiplier logic section 223 of FIG. 2B, for example, wherein a single accumulator memory 402 is used in accumulating the end result. Thus, partial product bits of individual multiplications are bit-serial, and the collective multiplications are performed in parallel, with the final result being accumulated in a single memory as the bit-serial multiplications progress.

Filter 400 is generally comprised of feed-forward path 400*a*, feedback path 400*b*, and serial accumulator 404. While not shown, it will be appreciated that control logic, comparable to that shown in FIG. 2, can be used to control the sequencing of the filter function since all multipliers are operating in parallel.

Feed-forward path 400*a* includes taps 410, 412, and 414, each including respective RAMs 416, 418, and 420 and ROMs 422, 424, and 426. RAMs 416, 418, and 420 and ROMs 422, 424, and 426 are implemented with FPGA function generators in the example embodiment, as described in FIG. 2. An input sample is first stored in RAM 416, and as the bit-serial multiplications progress, the sample is gradually written to RAM 418. Thus, after a sample has been input to filter 400 and the final output has been accumulated in memory 402, the sample will then be present in RAM 418, with filter 400 ready to begin processing the next input sample. A sample in RAM 418 is similarly gradually written to RAM 420. It will be appreciated that in order to preserve the samples for the duration of the bit-serial multiplication, the bit-by-bit transfer of a sample from the RAM of one tap to the RAM of the next tap does not commence until the MSBs of ROMs 422, 424, and 426 are accessed in the bit-serial multiplication. ROMs 422, 424, and 426 can be configured with application-specific coefficients.

Taps 410, 412, and 414 include respective multipliers 428, 430, and 432, each implemented with an FPGA function generator. Multipliers 428, 430, and 432 multiply input bits from the respectively coupled RAMs and ROMs. Taps 410 and 412 also include adders 434 and 436, respectively. An adder is unnecessary in tap 414 as it is the last tap in feed-forward path 410. Output from multiplier 432 is input to adder 436, along with output from multiplier 430. The partial accumulation from adder 436 is input to adder 434, along with output from multiplier 428. Adders 434 and 436 are also coupled to respective carry logic flip-flops 438 and 440.

Feedback path 400*b* includes taps 460, 462, and 464, with taps 462 and 464 including RAMs 466 and 468 and ROMs 470 and 472, respectively. Selected bits from adder 494 are provided as input to feedback path 400*b* via RAM 466. ROMs 470 and 472 can be configured with application-specific coefficients.

Feedback gate 480 selects which bits are fed back to filter 400. A control logic element (not shown) implements the selection of bits. Those skilled in the art of digital filters will recognize suitable logic for particular applications. In an example implementation, feedback gate 480 is implemented by selectively supplying a write-enable signal to RAM 466 and 468 (as well as to other feedback RAMS in higher order filters).

Taps 462 and 464 include respective multipliers 482 and 484, each implemented with an FPGA function generator. Multipliers 482 and 484 multiply input bits from the respectively coupled RAMs and ROMs. Taps 460 and 462 also include adders 486 and 488, respectively. An adder is unnecessary in tap 464 as it is the last tap in feedback path 460. Output from multiplier 484 is input to adder 488, along with output from multiplier 482. The partial accumulation from adder 488 is input to adder 486, along with output from adder 434 of feed-forward path 410. Adders 486 and 488 are also coupled to respective carry logic flip-flops 490 and 492, which hold local copies of the carry bit for each tap.

Addressing of sample memories 416, 418, and 420, coefficient memories 422, 424, 426, 470, and 472, feedback memories 466 and 468, and accumulator memory 402 can be sequenced with a single control logic element (for example, a control logic element that is comparable to control logic 222 of FIG. 2A). Such a control logic element includes three counters: counter A addresses sample memories 416, 418, and 420 and feedback memories 466 and 468, counter B addresses coefficient memories 422, 424, 426, 470, and 472 counter C addresses accumulator memory 402.

Filter 400 also includes serial accumulator 404, which accumulates partial results of the bit-serial output from adder 486 of feedback path 460. Serial accumulator 404 is comprised of adder 494, carry logic flip-flop 496, and memory 402. Output from adder 486 and an addressed bit from memory 402 are input to adder 494. The result is stored in memory 402 and also tapped by control logic 480 for feedback input to RAM 466.

It will be appreciated that accumulator 404 can be implemented in accordance with selection logic 224 and adder logic section 226 of FIG. 2B, for example. In addition, because filter 400 is implemented using distributed arithmetic techniques, a single accumulator memory 402 is used in filter 400. Therefore, taps 410, 412, 414, 462, and 464 do not require separate, respective accumulator memories, such as memory 210 of FIG. 2B. Those skilled in the art will recognize that distributed arithmetic involves adding the partial products from every tap in a combinational adder chain. It will be further appreciated that the individual taps do not require selection logic section 224 of FIG. 2B for selection of the sign extension and result memory feedback bits.

Filter 400 calculates a result based on a sample input in (n+1)*m clock cycles, where n is the number of bits of sample memories 416, 418, and 420, and m is the number of bits in coefficient memories 422, 424, 426, 470, and 472. The $Z^{-1}$ delays depicted in FIG. 1 are implemented in filter 400 by virtue of the time required to perform the bit-serial multiplications of the samples and coefficients and feedback values and coefficients before commencing transfer of the samples and feedback values to the next tap.

Included in each of multipliers 428, 430, 432, 482, and 484 is the 2's-complementing logic of FIG. 2B. That is, each tap 410, 412, 414, 462, and 464 implements 2's-complementing the multiplication and provides as output a correctly weighted and signed partial product as input to an adder (434, 436, 486, or 488).

The structure of filter 400 may be applied to $n^{th}$ order IIR filters. However, it will be appreciated that there may be filter instances where there is not a linear relationship between the order of the filter and the number of taps. For example, a $6^{th}$ order filter may require 7 taps instead of 6. Nonetheless, the bit-serial multiplication and distributed arithmetic implementations described herein are suitable for such filter instances.

It will be appreciated that by providing a sufficient clock rate for sequencing an IIR filter such as filter 400, additional channels could be implemented by interleaving additional RAM elements between the respective taps. Thus, the same taps can be used for an IIR filter with multiple channels, with the added cost being that for additional RAM for storage of sample and feedback values between the taps.

The present invention is believed to be applicable to a variety of programmable logic devices and has been found to be particularly applicable and beneficial in Xilinx FPGAs. While the present invention is not so limited, an appreciation of the present invention has been provided by way of specific examples involving FPGAs. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. An n-order infinite impulse response filter implemented in an FPGA, comprising:

n function generators configured as sample memories with data and address inputs and a data output, a first one of the sample memories configured with a data input to receive a sample input value, and others of the sample memories serially coupled with data outputs coupled to data inputs;

n−1 function generators configured as feedback memories with data and address inputs and a data output a first one of the feedback memories configured with a data input to receive a feedback input value, and others of the feedback memories serially coupled with data outputs coupled to data inputs;

2n−1 function generators configured as coefficient memories, each coefficient memory having an output;

2n−1 function generators configured as 1×1 bit multipliers, each coupled to outputs of a respective sample/coefficient memory pair and feedback/coefficient memory pair, wherein the multipliers coupled to sample/coefficient memory pairs are sample multipliers, and the multipliers coupled to the feedback/coefficient memory pairs are feedback multipliers;

2n−2 function generators configured as 1×1 bit adders, each having two inputs and an output, n−1 of the bit-serial adders coupled with the sample multipliers as a feed-forward chain and n−1 others of the bit-serial adders coupled with the feedback multipliers as a feedback chain, a first adder of the feed-forward chain having inputs coupled to outputs of two of the sample multipliers, a first adder of the feedback chain having inputs coupled to outputs of two of the feedback multipliers, others of the adders in the feed-forward chain having inputs coupled to respective outputs of multiplier/adder pairs in the feed-forward chain, others of the adders in the feedback chain having inputs coupled to respective outputs of multiplier/adder pairs in the feedback chain, one of the adders having inputs coupled to a last adder in the feed-forward chain and a last adder in the feedback chain; and one or more function generators configured as a scaling accumulator including an adder and a memory, the adder having a data input coupled to the output of the one of the adders and an output coupled to the memory and to a first one of the feedback memories, and the memory having an output coupled to an input of the adder; and a control circuit arranged to address the sample, coefficient, and feedback memories and the memory of the accumulator.

2. The filter of claim 1, wherein the control circuit comprises:

a first counter having outputs coupled to the address inputs of the sample memories and feedback memories;

a second counter having outputs coupled to the address inputs of the coefficient memories; and a third counter having outputs coupled to the address inputs of the memory of the accumulator.

3. The filter of claim 2, wherein the first, second, and third counters are implemented with a plurality of function generators.

4. The filter of claim 3, wherein the control circuit is configured to generate a result-bit-enable signal when a bit written to the product memory is valid as a partial result.

5. The filter of claim 1, wherein the control circuit is configured to generate a result-bit-enable signal when a bit written to the product memory is valid as a partial result.

6. The filter of claim 1, further comprising a plurality of control logic sections implemented in respective function generators and having an output respectively coupled to inputs of the multipliers, each control logic section configured to generate a complement-enable signal when a MSB of a value in an associated one of the sample memories and feedback memories is multiplied with a bit of a value in the associated coefficient memory.

* * * * *